United States Patent
Mirebeau et al.

(10) Patent No.: US 11,385,274 B2
(45) Date of Patent: Jul. 12, 2022

(54) CABLE JUNCTION WITH INTEGRATED SPACE CHARGE DETECTOR

(71) Applicant: NEXANS, Courbevoie (FR)

(72) Inventors: Pierre Mirebeau, Villebon sur Yvette (FR); Raphael Guffond, Lyons (FR)

(73) Assignee: NEXANS, Courbevoie (FR)

( * ) Notice: Subject to any disclaimer, the term of this patent is extended or adjusted under 35 U.S.C. 154(b) by 148 days.

(21) Appl. No.: 16/660,343

(22) Filed: Oct. 22, 2019

(65) Prior Publication Data
US 2020/0150171 A1 May 14, 2020

(30) Foreign Application Priority Data

Oct. 25, 2018 (FR) .................................... 18 59859

(51) Int. Cl.
| | |
|---|---|
| *G01R 29/24* | (2006.01) |
| *G01R 31/12* | (2020.01) |
| *G01R 31/16* | (2006.01) |
| *H02G 15/08* | (2006.01) |

(52) U.S. Cl.
CPC ......... *G01R 29/24* (2013.01); *G01R 31/1209* (2013.01); *G01R 31/16* (2013.01); *H02G 15/085* (2013.01)

(58) Field of Classification Search
CPC ........ G01R 1/00; H02G 1/00; H02G 2200/00; H01B 1/00
See application file for complete search history.

(56) References Cited

U.S. PATENT DOCUMENTS

| 9,110,105 B2* | 8/2015 | Shu ........................ G01R 15/16 |
| 2008/0077336 A1* | 3/2008 | Fernandes ................ H04Q 9/04 702/57 |
| 2008/0246485 A1* | 10/2008 | Hibbs ................ G01R 29/0871 324/332 |
| 2008/0309351 A1* | 12/2008 | Stewart .............. G01R 31/1272 324/551 |
| 2016/0017663 A1* | 1/2016 | Moeny .................. E21B 17/003 175/327 |
| 2016/0161543 A1* | 6/2016 | Andle ................ G01R 31/1218 324/551 |
| 2018/0045768 A1* | 2/2018 | Godfrey ............... G01R 31/086 |
| 2018/0062370 A1* | 3/2018 | Heidmann ........... H02G 15/046 |
| 2018/0113161 A1* | 4/2018 | Hines ................... G01R 15/148 |

FOREIGN PATENT DOCUMENTS

WO 2015052140 4/2015

OTHER PUBLICATIONS

International Search Report dated Apr. 30, 2019.

* cited by examiner

*Primary Examiner* — Jermele M Hollington
*Assistant Examiner* — Temilade S Rhodes-Vivour
(74) *Attorney, Agent, or Firm* — Sofer & Haroun, LLP

(57) ABSTRACT

This power cable junction (10) has an end part of a power cable which has an electrically insulating material (122). The junction (10) has a predetermined region containing a module for measuring the space charge of the insulating material (122).

6 Claims, 2 Drawing Sheets

CABLE JUNCTION WITH INTEGRATED SPACE CHARGE DETECTOR

RELATED APPLICATION

This application claims the benefit of priority from French Patent Application No. 18 59589, filed on Oct. 25, 2018, the entirety of which is incorporated by reference.

BACKGROUND

Field of the Invention

The present invention relates to a cable junction with integrated space charge detector.

The invention belongs to the field of power cables, used for example in electrical power distribution or transmission systems. These are generally high-voltage direct current, or HVDC, cables.

More specifically, the invention relates to a cable junction embedding a device that makes it possible to detect the space charge in the electrically insulating material included in the cable.

Description of the Related Art

The power cables of the type of those used for electrical power distribution or transmission generally comprise a central part or core made of conductive material, one or more layers of insulating material and a protective sheath. Other layers can be provided, such as shielding layers.

The power cables intended for high-voltage applications can comprise additional internal layers of electrical insulation whose function is to control the electrical field around the conductors contained in the cable.

Some electrically insulating materials, such as dielectric materials, can exhibit conductivity gradients and charge carrier traps which give rise to a space charge and a non-uniform distribution of the electrical field.

Now, if the electrical field becomes locally too high, it can provoke a rupturing of the electrical insulation.

The measurement of the spatial location of these charges makes it possible to determine the charge accumulation mechanisms and avoid such a rupturing of insulation. It is also an indicator of the state of health of the cable.

There are acoustic techniques for measuring the spatial location of these space charges, in which an acoustic pulse is excited and is propagated in the sample studied.

One of these acoustic techniques is known as the PEA technique, or pulsed electro-acoustic technique. It comprises the application to the sample of an external electrical field pulse, which results in a mechanical pulse originating from the charges contained in a dielectric material. The external electrical field in fact induces a force of disturbance on the charges, leading to a slight and rapid oscillation of these charges, through which acoustic vibrations are created in the dielectric material. These acoustic pressure waves are proportional to the local density of the charges in the sample.

These acoustic pressure waves can be detected by a transducer of piezoelectric type, a pressure transducer or pressure sensor, on one side of the dielectric.

By virtue of the measurement or the detection of the acoustic pressure waves, the output signal of the transducer or sensor can be used to deduce therefrom information on the amplitude and the location of the charges in the dielectric.

As described in the document SE-A-1400395, the PEA measurements are usually performed in a cell or measurement compartment in which the sample studied is placed, and, possibly, the pressure sensor.

That entails not only moving the sample studied into a place dedicated to these measurements, but also having access to the electrically insulating material which is the subject of the space charge measurement and having means necessary for the generation and the application of high-voltage pulses, as well as means necessary for recording the signal from the pressure transducer or sensor for the processing thereof, without compromising the operation of the sample under the usual direct current constraints.

OBJECTS AND SUMMARY

The aim of the present invention is to address these needs.

To this end, the present invention proposes a power cable junction comprising an end part of a power cable, the cable comprising an electrically insulating material, noteworthy in that it comprises a predetermined region containing a module for measuring the space charge of the insulating material.

Thus, the space charge measurement module is integrated in the junction. The junction is therefore equipped with an indicator of the "health" of the electrical insulation of the cable. That makes it possible to simply, easily and rapidly diagnose the trend of the quality of the electrical insulation in power cable links.

In a particular embodiment, the measurement module comprises at least two electrodes.

According to a possible particular feature, the measurement module can for example comprise six electrodes.

In a particular embodiment, the measurement module comprises a piezoelectric sensor.

That makes it possible to measure the space charge of the insulating material by using the PEA technique mentioned above.

In a particular embodiment, the measurement module further comprises at least one mechanical vibration damping element.

That makes it possible to eliminate the parasitic vibrations which disturb the space charge signal.

In a particular embodiment, the measurement module comprises an acoustic delay line.

That makes it possible to temporally separate the PEA signal from the parasitic vibrations caused by the electrical pulse, when the PEA technique mentioned above is used.

In a particular embodiment, the measurement module comprises a module for connecting a source of high-voltage electrical pulses.

That makes it possible to easily connect a source of high-voltage electrical pulses to the junction, in order to implement the PEA technique.

To the same end as that indicated above, the present invention also proposes a power cable, noteworthy in that it is equipped with at least one junction as briefly described above.

According to one possible particular feature, the power cable is of the high-voltage direct current, or HVDC, type.

According to one possible particular feature, the cable can be extruded.

Since the advantages and the particular features of the power cable are similar to those of the junction, they are not repeated here.

BRIEF DESCRIPTION OF THE DRAWINGS

Other aspects and advantages of the invention will become apparent on reading the following detailed description of particular embodiments, given as purely nonlimiting examples, with reference to the attached drawings, in which.

DETAILED DESCRIPTION

Figure 1:
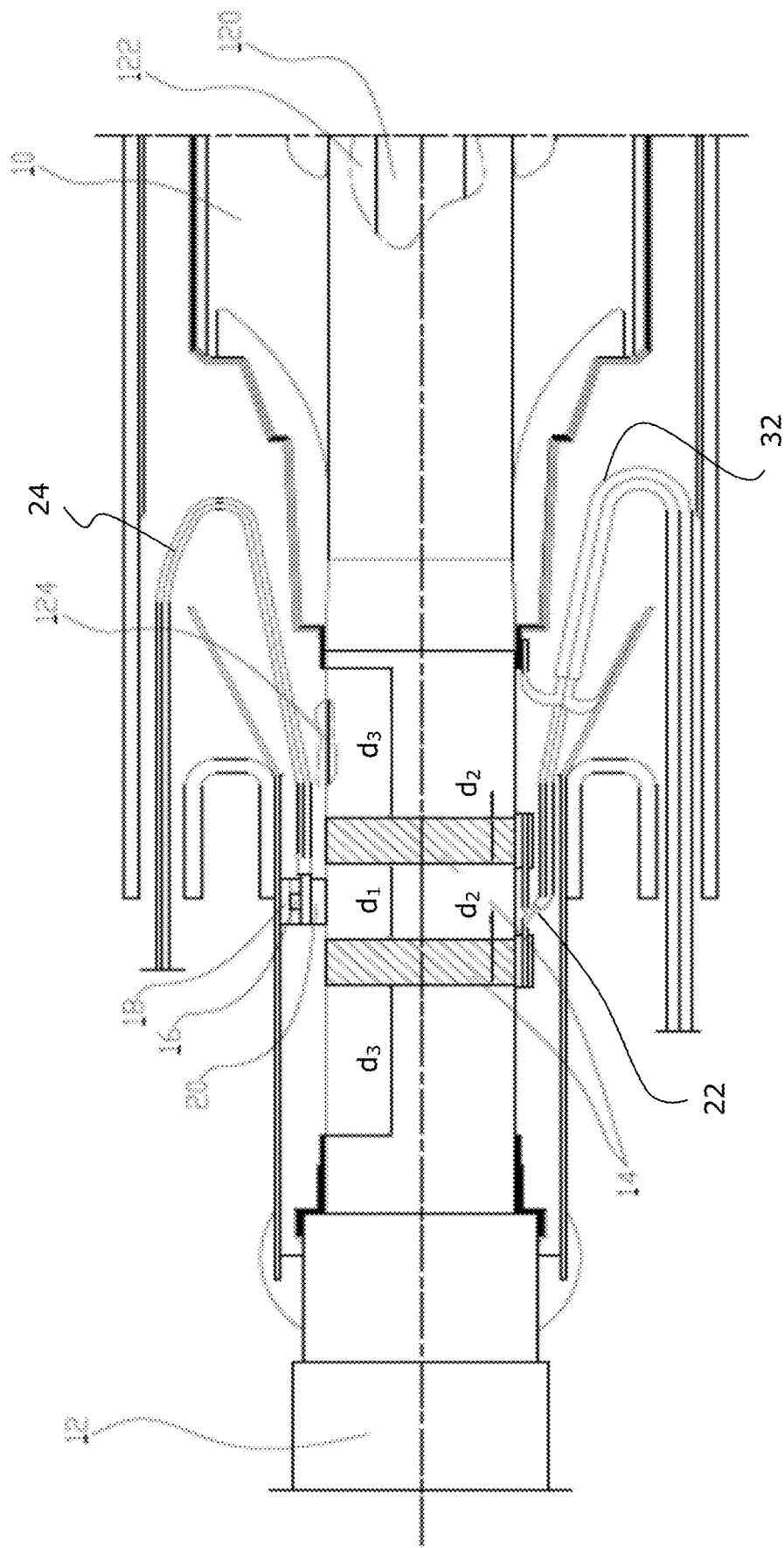
FIG. 1 is a schematic view of a power cable junction according to the present invention, in a particular embodiment, the view being limited to the part of the junction that is useful for representing the invention.

As the particular embodiment of FIG. 1 shows, a power cable junction 10 according to the invention links two power cables, of which only one, the cable 12, is represented, to simplify the drawing. The junction 10 comprises an end part of the cable 12.

The power cable 12 is for example of the high-voltage direct current, or HVDC, type.

As is known per se, the cable 12 comprises a central conductor 120, covered by a layer of electrically insulating material 122, which is itself covered by a layer of semiconductive material 124. The cable 12 can also comprise an internal semiconductive layer (not represented).

The insulating material of the layer 122 is for example chemically cross-linked polyethylene or CXLPE. It can also be a thermoplastic insulation material based on polyethylene or polypropylene. All these materials, which are given as nonlimiting examples, can be pure or filled.

According to the present invention, the junction 10 comprises a predetermined region containing a module for measuring the space charge of the insulating material of the layer 122.

This predetermined region of the junction 10 is for example one of its two ends.

The space charge measurement module comprises at least two electrodes 14. It can for example comprise six thereof. It also comprises a point of connection to the screen of the cable 12.

In the particular embodiment illustrated in FIG. 1, the space charge measurement module comprises two electrodes 14, the distance $d_1$ between the two electrodes 14 is of the order of 50 mm, the width $d_2$ of each electrode along the longitudinal axis of the cable 12 is of the order of 30 mm and the distance $d_3$ between each electrode 14 and the reconstitution of the metal screen, respectively cable side and junction side, is of the order of 100 mm.

The space charge measurement module further comprises a piezoelectric sensor 16.

The piezoelectric sensor 16 can for example be of the type based on polyvinylidene fluoride or PVDF. As a variant, it could also be of the type based on barium titanate ($BaTiO_3$).

The electrodes 14 and the connection to a central conductor 22 of a link 32 formed for example by a coaxial cable are used to create a high-voltage equipotential zone in line with the piezoelectric sensor 16.

The electrodes 14 are advantageously produced by a knit of tinned copper wires. As a variant, they can be produced in the form of copper ribbon, possibly tinned, or any other metallic material.

The electrodes 14 are for example wound around the cable 12, over its semiconductive layer 124.

Advantageously, the piezoelectric sensor 16 is separated from the outside from the electrostatic point of view, that is to say that it is in a Faraday cage, within the mechanical protective enclosure of the junction 10.

Advantageously, in order to eliminate the parasitic mechanical vibrations which disrupt the space charge measurement signal, the measurement module comprises at least one mechanical vibration damping element 18 placed in the vicinity of the piezoelectric sensor 16, for example in contact therewith.

The damping element 18 is for example made of EPDM (ethylene propylene diene monomer) or of rubber or any other material that absorbs mechanical vibrations.

To measure the space charge in the electrically insulating material 122 of the cable 12, the measurement module uses the PEA technique mentioned in the introduction.

To this end, the measurement module comprises a link formed for example by a coaxial cable 32, whose central conductor 22 is linked to the electrodes 14 and whose coaxial conductor is linked to the metal screen of the cable 12 and of the junction 10. This coaxial cable 32 and its central conductor 22 are means for connecting a source of high-voltage electrical pulses. The source of electrical pulses is external to the junction.

In order to temporally separate the PEA signal from the parasitic vibrations caused by the electrical pulse, the measurement module also comprises an acoustic delay line 20, connected to the piezoelectric sensor 16.

The electrical field applied to the electrically insulating material of the cable 12 by the source of high-voltage electrical pulses generally lies between 0.2 kV and 2 kV per mm of thickness of insulation of the cable 12 and is preferably approximately equal to 0.5 kV/mm.

Upon the application of this electrical field, the piezoelectric sensor 16 detects the acoustic pressure waves originating from the charges present in the cable 12. The measurement of these charges can be collected via a link connected to the piezoelectric sensor 16 and formed for example by a coaxial cable 24.

Figure 2:
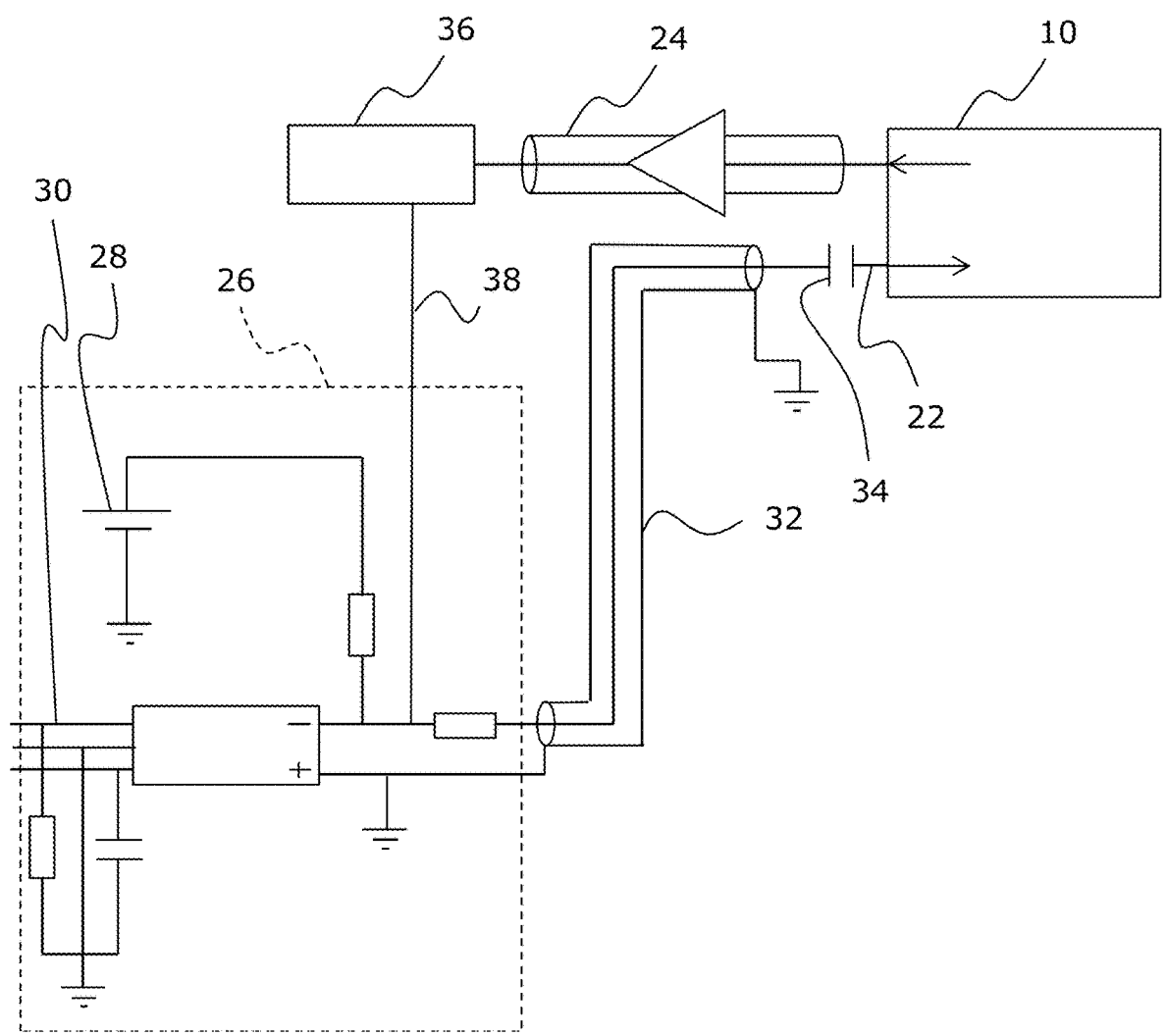
FIG. 2 is an electrical circuit corresponding to the measurement of the space charge according to the present invention, in a particular embodiment.

The diagram of FIG. 2 represents a particular embodiment of an electrical circuit formed by the space charge measurement module according to the invention and the external source 26 of high-voltage electrical pulses.

The external source 26 of high-voltage electrical pulses is powered by a high-voltage generator 28 (typically 10 kV) and generates high-voltage pulses from a wave form 30. These pulses are supplied as input to the junction 10 via the link 32 formed for example by a coaxial cable and via a decoupling capacitor 34.

In order to collect the measurement of the space charge, the signal originating from the piezoelectric sensor 16 is routed via the coaxial cable 24 to a display device 36, such as an oscilloscope.

The display device 36 can moreover be equipped with a means for triggering the high-voltage electrical pulses, connected to the external source 26 of high-voltage electrical pulses via a link 38.

Thus, a cable 12 according to the invention, equipped with at least one junction 10 as described above, presents, by virtue of the space charge measurement module contained in the junction, an integrated indicator of the trend of the quality of its electrical insulation. The primary application targeted by the invention concerns high-voltage direct current, or HVDC, cables, which are for example extruded cables, but the invention is not limited to this type of cables.

The invention has been described here in its application to the measurement of the space charge within the electrically insulating material of the power cable that the junction links to another cable. However, the invention applies similarly to the measurement of the space charge within the electrically insulating material of the junction itself.

The invention claimed is:

1. A power cable junction comprising:
an end part of a power cable, said cable having an electrically insulating material, wherein said power cable junction has a predetermined region containing a module for measuring the space charge of said insulating material,
wherein said measurement module comprises at least two electrodes,
a piezoelectric sensor,
at least one mechanical vibration damping element placed in contact with the piezoelectric sensor, and
means for connecting a source of high-voltage electrical pulses, such source of high-voltage electrical pulses being external to the junction and those means for connecting being made of a coaxial cable, whose central conductor is linked to the electrodes and whose coaxial conductor is linked to the metal screen of the cable and of the junction.

2. The power cable junction according to claim 1, wherein said measurement module comprises six electrodes.

3. The power cable junction according to claim 1, wherein said measurement module comprises an acoustic delay line.

4. A power cable, wherein said power cable is equipped with at least one power cable junction according to claim 1.

5. The cable according to claim 4, wherein said cable is of the high-voltage direct current, or HVDC, type.

6. The cable according to claim 4, wherein said cable is extruded.

* * * * *